(12) United States Patent  
Venkata

(10) Patent No.: US 8,929,164 B2
(45) Date of Patent: Jan. 6, 2015

(54) APPARATUSES AND METHODS FOR ADJUSTMENT OF DATA STROBE SIGNALS

(75) Inventor: Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 13/412,523

(22) Filed: Mar. 5, 2012

(65) Prior Publication Data

US 2013/0229884 A1     Sep. 5, 2013

(51) Int. Cl.
*G11C 7/00*     (2006.01)
(52) U.S. Cl.
USPC .......................................... 365/194; 365/193
(58) Field of Classification Search
USPC .......................................... 365/194, 193, 196
See application file for complete search history.

(56) References Cited

U.S. PATENT DOCUMENTS

| | | |
|---|---|---|
| 5,748,554 A | 5/1998 | Barth et al. |
| 6,895,484 B2 * | 5/2005 | Wen et al. ...................... 711/167 |
| 7,161,854 B2 * | 1/2007 | Iwasaki ......................... 365/193 |
| 7,272,055 B2 * | 9/2007 | Kishimoto et al. ........... 365/194 |
| 7,929,369 B2 | 4/2011 | Lee et al. |
| 7,983,100 B2 | 7/2011 | Shan et al. |
| 2010/0265780 A1 | 10/2010 | Park et al. |

* cited by examiner

*Primary Examiner* — Vu Le
(74) *Attorney, Agent, or Firm* — Dorsey & Whitney LLP

(57) ABSTRACT

Methods and apparatuses for adjusting data strobe signals are disclosed. An example apparatus may include a control circuit that is configured to receive an address and a strobe signal. The control circuit may further be configured to delay the strobe signal based, at least in part on the address to provide a delayed strobe signal. The example apparatus may further include a sense amplification circuit coupled to the control circuit. The sense amplification circuit may be configured to sense signals responsive, at least in part, to receipt of the delayed strobe signal.

20 Claims, 4 Drawing Sheets

APPARATUSES AND METHODS FOR ADJUSTMENT OF DATA STROBE SIGNALS

TECHNICAL FIELD

Embodiments of this invention relate generally to memory, and more particularly, in one or more of the illustrated embodiments, to adjusting the timing of data strobe signals.

BACKGROUND OF THE INVENTION

In various memories, data may be read from memory sections and provided to external devices via lines, such as global data lines. Typically, sense amplifiers are located at an end of these lines and are configured to sense data on the lines in response to a signal, such as a strobe signal.

As memory density and complexity has increased over time, the data lines extending through memories have increased in both length and number. Line length in particular has been a design constraint. For example, as the further a section coupled to a line is located from the sense amplifier, also coupled to that line, the greater the amount of time that is required for the section to drive the line to a condition that may be accurately sensed by the sense amplifier.

In conventional systems, the time at which a sense amplifier senses data on a line is delayed by a predetermined amount relative to receipt of a command to ensure accurate sensing of data. Typically, a worst case delay is implemented in each operation such that even the furthest section on a line may drive lines to conditions sufficient for accurate sensing before a sense amplifier is enabled.

By implementing this delay, however, power may be needlessly consumed. Specifically, the closer a section is located relative to a sense amplifier, the less time that is required for the lines to be driven to the condition sufficient for accurate sensing by the sense amplifier, and, as a result, the more time that a section continues to drive the lines beyond the condition until the sense amplifier is enabled unnecessarily consumes power.

DETAILED DESCRIPTION

Methods and apparatuses for adjusting data strobe signals are disclosed. In accordance with one or more embodiments of the present invention, a strobe signal may be adjusted, based, at least in part, on an address. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
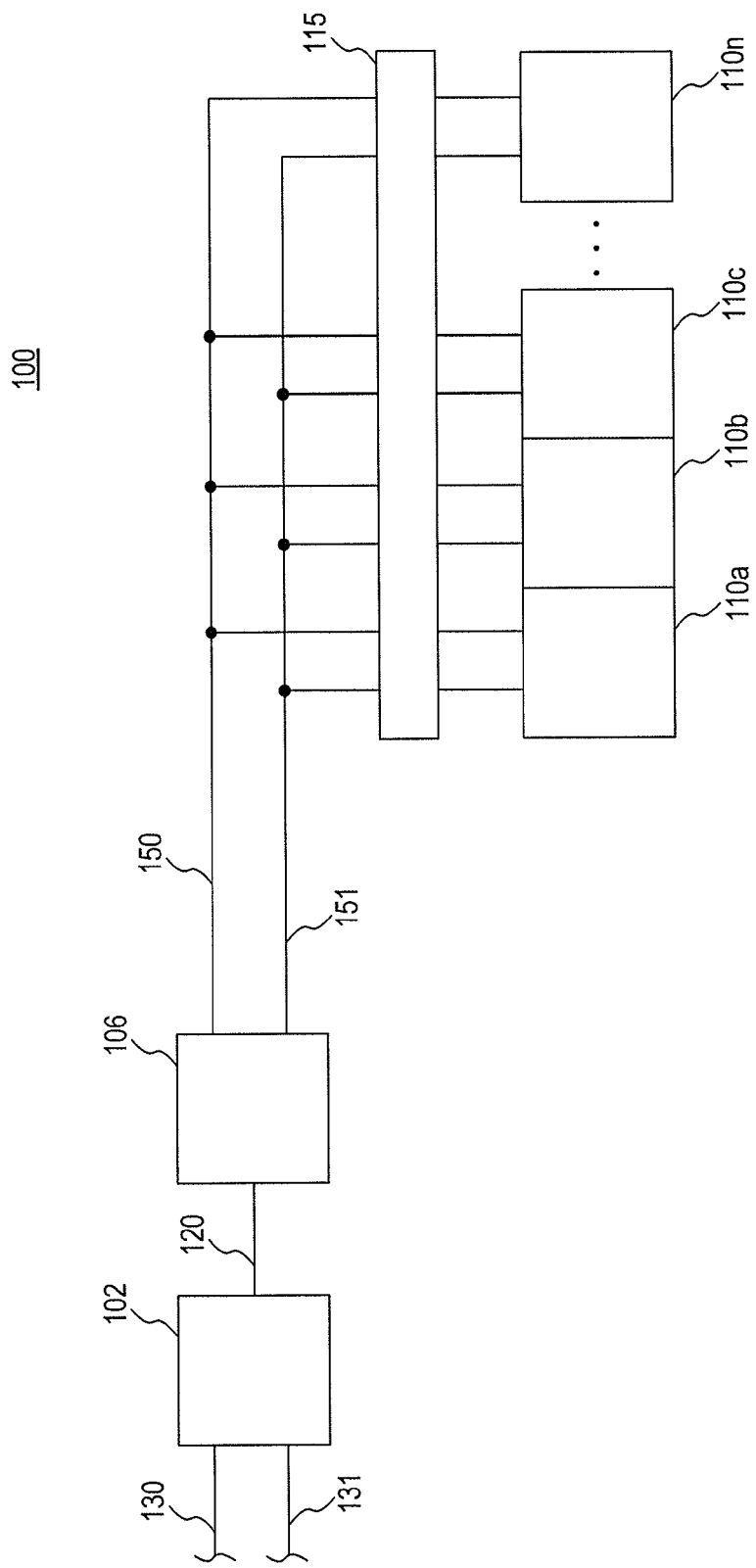
FIG. 1 illustrates a block diagram of an apparatus according to an embodiment of the invention.

FIG. 1 illustrates an apparatus 100 according to an embodiment of the invention. The apparatus 100 may include a control circuit 102, a sense amplification circuit 106, and a plurality of memory sections 110. The control circuit 102 may be coupled to the sense amplification circuit 106 by a bus 120, and the plurality of memory sections 110 may be coupled to the sense amplification circuit 106 via switching logic 115 and lines 150, 151. The control circuit 102 may comprise one or more logic circuits, control logic, logic gates, and/or any combination or sub-combination of the same. The sense amplification circuit 106 may comprise one or more sense amplifiers (not shown in FIG. 1) and may be configured to sense voltages and/or currents of signals (e.g. data signals) on lines 150, 151 and amplify the signals. In some embodiments, the sense amplification circuit 106 is configured to sense a difference in signal levels (e.g., voltage and/or current levels) between the lines 150, 151 and amplify the difference. Sense amplifiers included in the sense amplification circuit 106 may comprise voltage sense amplifiers, current sense amplifiers, a combination of the same, and/or any other sense amplifiers and/or combination of sense amplifiers known by those having ordinary skill in the art.

The signals are provided to lines 150, 151 by one or more sections 110, which drive the lines 150, 151 to respective signal levels. The signals provided to the lines 150, 151 by a section 110 are representative of data stored in the section and being read from memory. When the lines 150, 151 are driven to respective signal levels that may be properly sensed the sense amplification circuit 106 may accurately amplify the signals. That is, for example, the lines 150, 151 are driven to respective voltage and/or current levels that allow the sense amplification circuit 106 to sense and accurately amplify the signals provided by the sections 110. In embodiments having a sense amplification circuit 106 that senses and amplifies a difference in signal levels, the signal levels that may be properly sensed represent a signal level difference between lines 150, 151, such as a voltage and/or current difference between the signal levels of lines 150, 151.

The switching logic 115 may comprise one or more logic circuits, control logic, logic gates, and/or any combination or sub-combination of the same, and may be configured to couple one or more of the sections 110 to the lines 150, 151 to provide signals thereon. In at least one embodiment, the switching logic 115 may comprise a plurality of transistors. The plurality of transistors may, for instance, be configured to couple one or more of the sections 110 to the lines 150, 151 responsive, at least in part, to receipt of one or more control signals. The control signals may be based, at least in part, on an address signal.

The plurality of sections 110 may comprise 16, 32, or 64 sections, or may comprise any other number of sections. Moreover, sections 110 may comprise sections of a memory array and each section 110 may have any number of memory cells. The lines 150, 151 may be configured to conduct data signals between one or more of the sections 110 and the sense amplification circuit 106, and as known, each line may be used to carry a complementary signal of the signal on the other line. Each line 150, 151 may have an impedance (e.g., resistance and/or capacitance) which may be distributed over the length of the line. The lines 150, 151 may be, for instance, data lines, and in particular, relatively long data lines and/or global data lines.

Each of the plurality of sections 110 may have a different position relative to the sense amplification circuit 106 along the lines 150, 151. As an example, the plurality of sections 110 may be arranged in a single row such that each section 110 is located a respective distance along the lines 150, 151 from the sense amplification circuit 106, or the plurality of sections 110 may be arranged in multiple rows and/or clusters. Consequently, each section 110 may have a respective impedance between itself and the sense amplification circuit 106. That is, a section 110 that is closer to the sense amplification circuit 106 along the lines 150, 151 will have less impedance between it and the sense amplification circuit 106 than a section 110 that is further away from the sense amplification circuit 106 along the lines 150, 151. In other words, because each of the lines 150, 151 may have respective impedances distributed over their lengths, the respective impedances between sense amplification circuit 106 and the sections 110 may be different based at least in part on the relative position of a section to the sense amplification circuit. Referring to FIG. 1, section 110a, for example, may be more closely positioned along the lines 150, 151 to the sense amplification circuit 106 than, for instance, section 110n. As a result, the impedance between sense amplification circuit 106 and section 110a may be less than between the sense amplification circuit 106 and section 110n. For example, the impedance between the sense amplification circuit 106 and the section 110a may be less than the magnitude of the impedance between the sense amplification circuit 106 and the section 110n.

In an example operation, a strobe signal, and an address (e.g. memory address), may be applied to buses 130, 131, respectively, and both the signal and the address may be received by the control circuit 102. The switching logic 115 may also receive the address, and in response may couple one or more of the sections 110 to the lines 150, 151 based, at least in part, on the address, thereby causing the one or more of the sections 110 to provide (e.g., drive) signals to the lines 150, 151. The control circuit 102 may subsequently provide the strobe signal to the sense amplification circuit 106 via the bus 120, and responsive, at least in part, to receipt of the strobe signal, the sense amplification circuit 106 may sense the signals on lines 150, 151. As will be explained, the control circuit 102 may be configured to adjust the timing of the strobe signal based, at least in part, on the address.

In at least one embodiment, the control circuit 102 may be configured to adjust the timing of the strobe signal by delaying when the strobe signal is provided to the sense amplification circuit 106 to control the timing of when the sense amplification circuit 106 begins sensing signals on lines 150, 151. For instance, the address received may correspond to a section 110 and/or indicate the position of the section 110 relative to the sense amplification circuit 106. As an example, the farther a section 110 is positioned relative to the sense amplification circuit 106, the greater the amount the control circuit 102 may delay the strobe signal, and as a result, delay when the sense amplification circuit 106 begins sensing lines 150, 151. Put another way, the closer a section is relative to the sense amplification circuit 106, the sooner, relative to the strobe signal being applied to the bus 130, that the control circuit 102 will provide the strobe signal to the bus 120 to control the sense amplification circuit 106 to begin sensing. If the address corresponds to a section 110 relatively close to the sense amplification circuit 106 along lines 150, 151, such as the section 110a, the control circuit 102 may provide the strobe signal to the bus 120 with relatively lesser or no delay. If the address corresponds to a section relatively farther from the sense amplification circuit 106 along lines 150, 151, for instance, the section 110n, the control circuit 102 may provide the strobe signal to the bus 120 after providing a greater delay. That is, the farther a section 110 is to the sense amplification circuit 106 along lines 150, 151, the slower the sense amplification circuit 106 is controlled to begin sensing.

The control circuit 102 may also be configured to delay the strobe signal in other ways as well. As another example, the control logic 102 may delay the strobe signal a same amount for more than one section 110. For instance, in one embodiment, respective pairs of sections 110 may correspond to a same delay. In other embodiments, any other number of sections 110 may correspond to a same delay, or the number of sections 110 corresponding to respective delays may vary. It will be appreciated by those having skill in the art, that other implementations may be used without departing from the scope of the invention.

As previously discussed, the respective impedances along the length of the lines 150, 151 between each of the plurality of sections 110 and the sense amplification circuit 106 may vary. Accordingly, in providing signals to the lines 150, 151, the respective times required for each of the plurality of sections 110 to drive the lines 150, 151 to signal levels that may be properly sensed, for instance by the sense amplification circuit 106, may also vary. The greater the impedance, for example, the more time that may be required for a line to be driven from a previous signal level amplified by the sense amplification circuit 106 to a new signal level that may be properly sensed. Moreover, the more time a section 110 provides signals to the lines 150, 151, the more power that may be consumed. Thus, it may be desirable for signals on lines 150, 151 to be sensed as soon as the lines have been driven to signal levels that may be properly sensed. Power consumed to drive signal levels of lines 150, 151 in excess of that which may be properly sensed is essentially wasted. Accordingly, controlling the timing of the sense amplification circuit 106 to begin, sensing shortly after when the lines 150, 151 have been driven to signal levels that may be properly sensed may result in reduced power consumption.

As previously described, the timing of sense amplification circuit 106 may be controlled by delaying the strobe signal provided to the sense amplification circuit 106. In at least one embodiment, the control circuit 102 may be configured to delay a strobe signal with delays based, at least in part, on the respective amounts of time required for particular sections 110 to drive the lines 150, 151 to respective signal levels that may be properly sensed. For example, for sections 110 that are relatively closer to the sense amplification circuit 106 along the lines 150, 151, and have less line impedance to drive and consequently will drive the lines 150, 151 to signal levels that may be properly sensed relatively sooner than sections 110 relatively further away, the sense amplification circuit 106 can be controlled to begin sensing relatively sooner than for sections 110 that are relatively further away from the sense amplification circuit 106.

Figure 2:
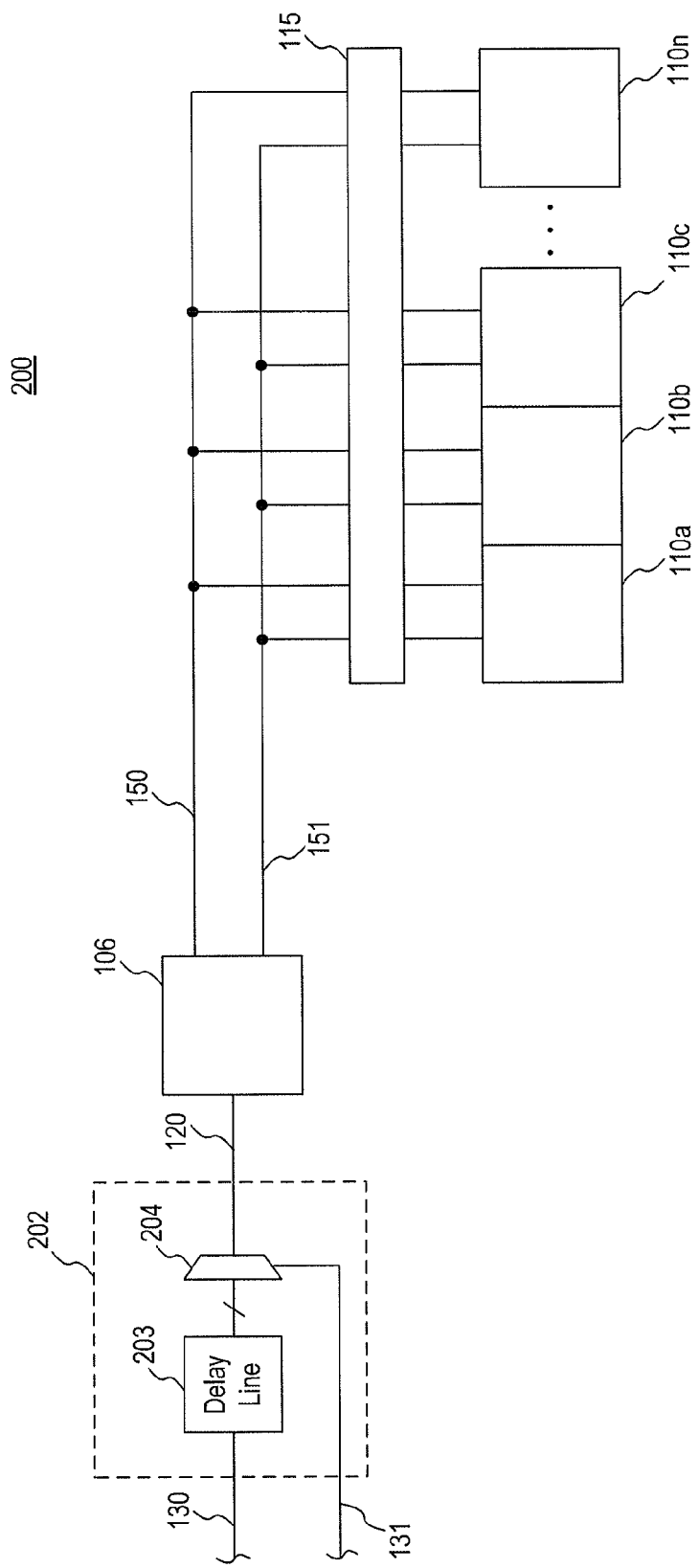
FIG. 2 illustrates a block diagram of an apparatus according to an embodiment of the invention.

FIG. 2 illustrates an apparatus 200 including a control circuit 202 according to an embodiment of the present invention. The control circuit 202 may be used as the control circuit 102 of FIG. 1. The apparatus 200 includes elements that have been previously described with respect to the apparatus 100 of FIG. 1. Those elements have been identified in FIG. 2 using the same reference numbers used in FIG. 1 and operation of the common elements is as previously described. Consequently, a detailed description of the operation of these elements will not be repeated in the interest of brevity.

The control circuit 202 includes a delay circuit 203 and a selector circuit 204. The delay circuit 203 may be coupled to the selector circuit 204 and may comprise a conventional delay line as is known in the art. The delay circuit 203 may be configured to receive a strobe signal on bus 130 and generate one or more delayed signals based, at least in part, on the received signal. The delay circuit 203 may be configured to provide the delayed signals having a respective delay relative to the signal received on the bus 130. In some embodiments, the delay circuit includes a delay line having a plurality of delay stages with each of the delayed signals provided from a different portion along the delay line, thus, each of the delayed signals has a respective delay relative to the strobe signal on the bus 130. The selector circuit 204 is provided an address on bus 131 and may comprise a multiplexer, interleaving circuit, switching circuit, or other logic that is known in the art and may be configured to selectively provide one or more of a plurality of signals provided by the delay circuit 203 based at least in part on the address provided on bus 131.

In an example operation, a strobe signal may be applied to the bus 130 and received by the delay circuit 203 of the control circuit 202. The delay circuit 203 may delay the strobe signal and thereby provide a plurality of delayed strobe signals to the selector circuit 204. The delay circuit 203 may, for example, provide a respective delayed strobe signal to the selector circuit 204 for each of the plurality of sections 110. In other embodiments, the delay circuit 203 may provide a respective delayed strobe signal for each pair of sections 110, or may provide any other number of delayed strobe signals. Moreover, each of the delays may comprise any amount of delay, and/or each delay may also correspond to the amount of time required for one or more of the sections 110 to drive the lines 150, 151 to respective signal levels that may be properly sensed by the sense amplification circuit 106. It will be appreciated by those having ordinary skill in the art that other implementations may be used without departing from the scope of the invention.

The selector circuit 204 may receive the plurality of delayed strobe signals and selectively provide one or more of the plurality of delayed strobe signals based, at least in part, on an address applied to the bus 131. The selected strobe signal may be provided to the bus 120, thereby controlling the sense amplification circuit 106 to sense signals on lines 150, 151, as described above with reference to FIG. 1. As a result, the timing of when the sense amplification circuit 106 begins sensing signals on lines 150, 151 may be different for different sections 110 (FIG. 1), the different sections identified by the address applied to the bus 131.

Figure 3:
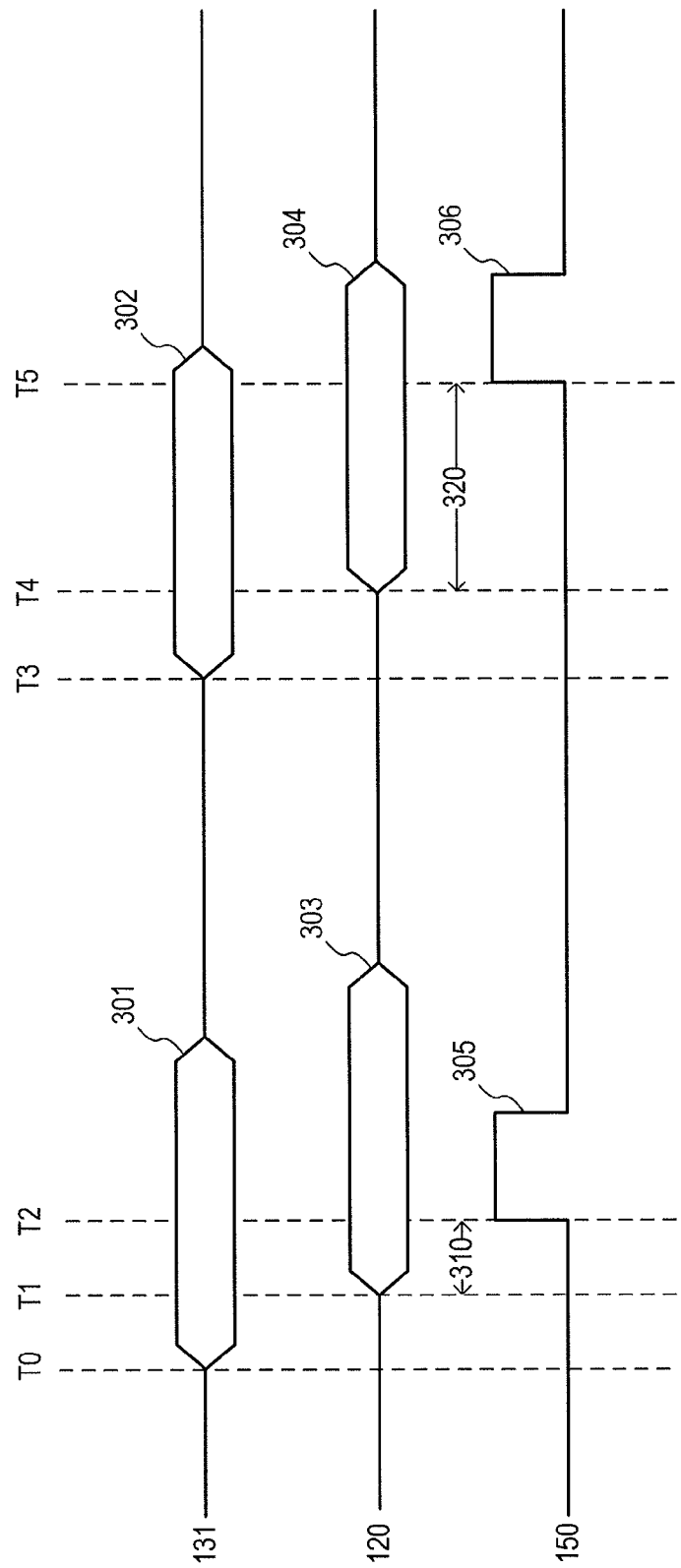
FIG. 3 illustrates a timing diagram of an operation of the apparatus of FIG. 1 according to an embodiment of the invention

FIG. 3 illustrates a timing diagram of various signals during an operation of the apparatus 100 in accordance with an embodiment of the invention. Reference is made to two sections 110, sections 110a and 110n, as an example only, and the operation described herein may be applicable to any number of the sections 110. At time T0, an address 301 which identifies section 110a may be applied to the bus 131 and provided to the control logic 102. At time T1, the section 110a may provide signals 303 corresponding to the address 301 and drive the lines 150, 151 as described above. After a delay 310, at time T2, the control circuit 102 may provide a strobe signal 305 to cause the sense amplification circuit 106 to sense signals on the lines 150, 151 as described above. At time T3, an address 302 which identifies section 110n may be applied to the bus 131 and at time T4, the section 110n provides signals 304 corresponding to the address 302 and drives the lines 150, 151. After a delay 320, at time T5, the control circuit 102 may provide a strobe signal 306 to cause the sense amplification circuit 106 to sense signals on the lines 150, 151. Notably, the delay 310 is shorter than delay 320.

As previously discussed, section 110a may have less impedance between it and the sense amplification circuit 106 than section 110n (e.g., section 110a is relatively closer along the lines 150, 151 than section 110n), and as a result, the amount of time required for the section 110a to drive lines 150, 151 to signal levels that may be properly sensed may be less than the amount of time required for the section 110n to drive lines 150, 151 to signal levels that may be properly sensed. Accordingly, the delay 310, after which time the sense amplification circuit 106 is controlled to begin sensing the lines 150, 151, for section 110a may be shorter than the delay 320, after which the sense amplification circuit 106 is controlled to begin sensing the lines 150, 151, for section 110n. The control logic 102 may thus be configured to delay the strobe signal for sensing signals from the section 110a less than the strobe signal used for sensing signals from the section 110n. In other words, the control logic 102 may be configured to control the sense amplification circuit 106 to begin sensing signals on lines 150, 151 from section 110a sooner than for signals on lines 150, 151 from section 110n. Although not illustrated in FIG. 3, it will be appreciated that for sections having greater impedance than section 110a and less impedance than section 110n (e.g., sections positioned further away than section 110a but closer than section 110n) the strobe signal may be delayed greater than delay 310 and shorter than delay 320.

Figure 4:
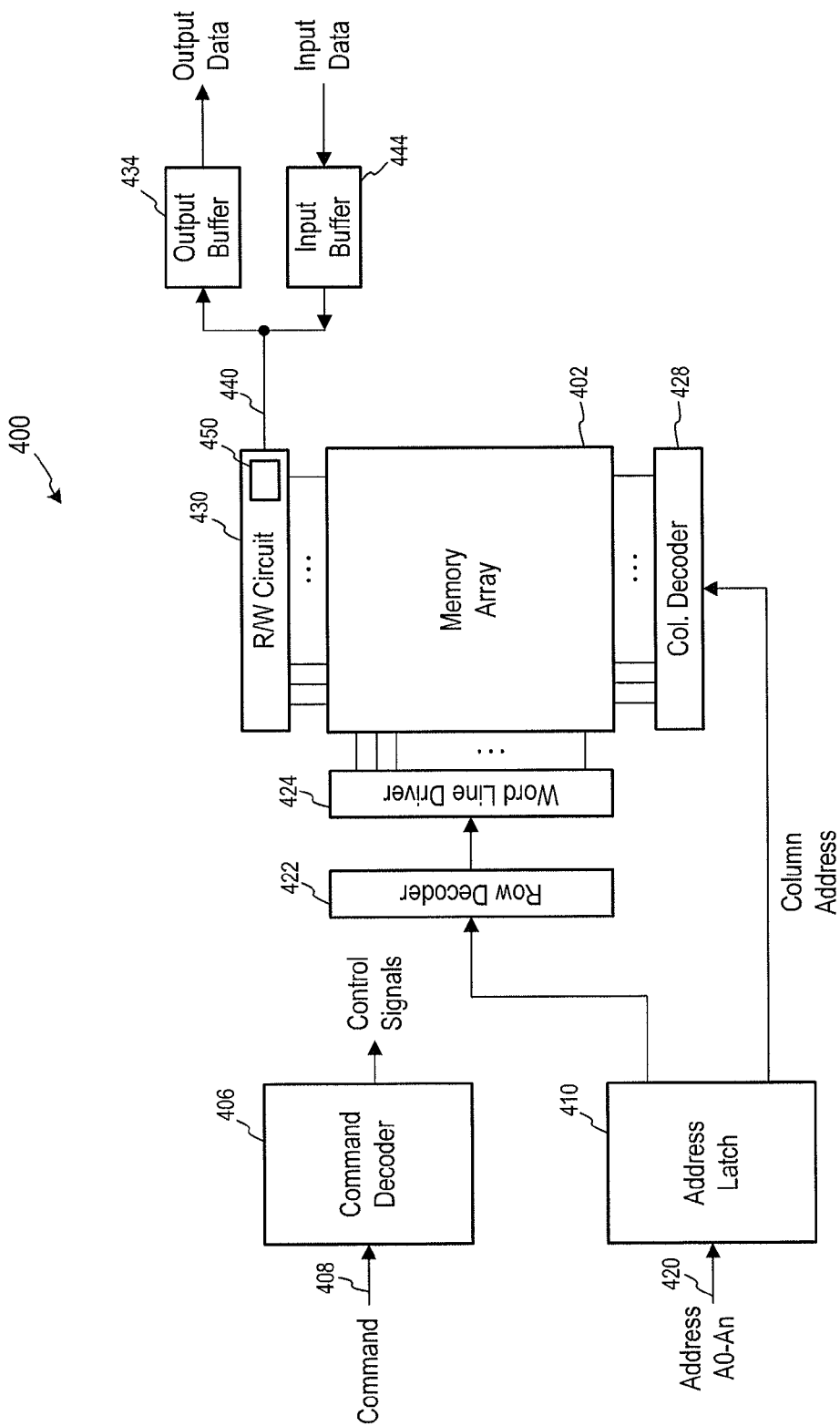
FIG. 4 illustrates a memory according to an embodiment of the invention.

FIG. 4 illustrates a portion of a memory 400 according to an embodiment of the invention. The memory 400 includes an array 402 of memory cells, which may be any memory cells, for example, DRAM memory cells, SRAM memory cells, flash memory cells, capacitive memory cells, resistive memory cells, non-volatile memory cells, and volatile memory cells. The memory 400 includes an address/command decoder 406 that receives memory commands and addresses through an ADDR/CMD bus. The address/command decoder 406 generates control signals, based on the commands received through the ADDR/CMD bus. The address/command decoder 406 also provides row and column addresses to the memory 400 through an address bus and an address latch 410. The address latch then outputs separate column addresses and separate row addresses.

The row and column addresses are provided by the address latch 410 to a row address decoder 422 and a column address decoder 428, respectively. The column address decoder 428 selects lines extending through the array 402 corresponding to respective column addresses. The row address decoder 422 is connected to word line driver 424 that activates respective rows of memory cells in the array 402 corresponding to received row addresses. The selected line (e.g., a bit line or bit lines) corresponding to a received column address are coupled to a read/write circuitry 430 to provide read data to a data output circuit 434 via an input-output data bus 440. Write data are provided to the memory array 402 through a data input circuit 444 and the memory array read/write circuitry 430.

At least a portion of the read/write circuitry 430 may include an apparatus 450, which may be similar to any of the apparatuses 100 or 200 described above. In addition to, or in place of, the apparatus 450 of the read/write circuitry 430, an apparatus 450 may also be included on input-output data bus 440, in between the memory array 402 and the read/write circuitry 430, or in any other location in the memory 400.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a control circuit configured to receive an address and a strobe signal, the control circuit configured to delay the strobe signal based, at least in part, on the address to provide a delayed strobe signal; and
a sense amplification circuit coupled to the control circuit and configured to sense signals, responsive, at least in part, to receipt of the delayed strobe signal.

2. The apparatus of claim 1, further comprising:
a plurality of sections, the sense amplification circuit configured to receive the signals from a section of the plurality of sections.

3. The apparatus of claim 2, further comprising:
switching logic coupled to the sense amplification circuit and the plurality of sections, the switching logic configured to selectively couple at least one of the plurality of sections to the sense amplification circuit based, at least in part, on the address.

4. The apparatus of claim 1, wherein the sense amplification circuit comprises a current sense amplifier.

5. The apparatus of claim 1, wherein the control circuit comprises a delay circuit configured to receive the strobe signal and provide a plurality of delayed strobe signals based, at least in part, on the strobe signal.

6. The apparatus of claim 5, wherein the control circuit further comprises a selector circuit coupled to the delay circuit and configured to receive the plurality of delayed strobe signals, the selector circuit configured to provide one of the plurality of delayed strobe signals to the sense amplification circuit based, at least in part, on the address.

7. An apparatus, comprising:
a memory section having a position relative to a sense amplification circuit; and
a control circuit configured to receive a strobe signal, the control circuit configured to delay the strobe signal based, at least in part, on the position.

8. The apparatus of claim 7, wherein the control circuit is further configured to provide the strobe signal to the sense amplification circuit.

9. The apparatus of claim 8, therein the sense amplification circuit is configured to sense signals provided by the memory section responsive, at least in part, to receipt of the strobe signal.

10. The apparatus of claim 7, wherein the sense amplification circuit comprises a current sense amplifier.

11. The apparatus of claim 7, wherein the delay is based, at least in part, on the impedance of a line.

12. The apparatus of claim 7, wherein the control circuit comprises:
a selector circuit configured to provide one of a plurality of delayed strobe signals based, at least in part, on the location.

13. An apparatus, comprising:
a sense amplification circuit; and
a control circuit, wherein the control circuit comprises:
a delay circuit configured to receive a strobe signal and provide a delayed strobe signal based, at least in part, on the strobe signal; and
a selector circuit coupled to the delay circuit and configured to receive the delayed strobe signal, the selector circuit further configured to provide the delayed strobe signal to the sense amplification circuit responsive, at least in part, to receipt of an address.

14. The apparatus of claim 13, wherein the apparatus is included in a memory.

15. The apparatus of claim 13, wherein the selector circuit comprises a multiplexer.

16. The apparatus of claim 13, further comprising switching logic configured to receive the address, the switching logic further configured to couple a memory section to the sense amplification circuit based, at least in part, on the address.

17. A method, comprising:
receiving an address;
receiving a strobe signal;
delaying the strobe signal based, at least in part, on the address; and
providing the delayed strobe signal to a sense amplification circuit.

18. The method of claim 17, further comprising:
sensing data signals based, at least in part, on receipt of the delayed strobe signal.

19. The method of claim 18, wherein the sense amplification circuit comprises a current sense amplifier.

20. The method of claim 18, wherein said delaying the strobe signal, comprises:
generating a plurality of delayed strobe signals based, at least in part, on the strobe signal; and
selecting one of the plurality of delayed strobe signals based, at least in part, on the address.

* * * * *

UNITED STATES PATENT AND TRADEMARK OFFICE
CERTIFICATE OF CORRECTION

PATENT NO. : 8,929,164 B2  
APPLICATION NO. : 13/412523  
DATED : January 6, 2015  
INVENTOR(S) : Harish N. Venkata Page 1 of 1

It is certified that error appears in the above-identified patent and that said Letters Patent is hereby corrected as shown below:

In the Claims

In column 7, line 41, in Claim 9, delete "therein" and insert -- wherein --, therefor.

Signed and Sealed this
Twenty-fourth Day of March, 2015

Michelle K. Lee
*Director of the United States Patent and Trademark Office*